(12) United States Patent
Koo et al.

(10) Patent No.: US 9,123,892 B2
(45) Date of Patent: Sep. 1, 2015

(54) POLYMER BLEND COMPOSITION AND ACTUATORS USING THE SAME

(75) Inventors: Chong-Min Koo, Gyeonggi-do (KR); Soon-Man Hong, Seoul (KR); Kyung-Youl Baek, Seoul (KR); Seung-Sang Hwang, Seoul (KR); Youn-Duk Park, Seoul (KR); Kyung-Ho Min, Seoul (KR); Jin-Hong Lee, Busan (KR); Yun-Jae Lee, Gyeonggi-do (KR); Ji-Young Jung, Daejeon (KR); Jang-Woo Lee, Seoul (KR)

(73) Assignee: KOREA INSTITUTE OF SCIENCE AND TECHNOLOGY, Seoul (KR)

( * ) Notice: Subject to any disclaimer, the term of this patent is extended or adjusted under 35 U.S.C. 154(b) by 153 days.

(21) Appl. No.: 13/466,292

(22) Filed: May 8, 2012

(65) Prior Publication Data

US 2012/0286627 A1 Nov. 15, 2012

(30) Foreign Application Priority Data

May 12, 2011 (KR) .................. 10-2011-0044784

(51) Int. Cl.
*H01L 41/18* (2006.01)
*C08L 53/00* (2006.01)
*H01L 41/193* (2006.01)
*C08L 27/16* (2006.01)
*C08J 5/18* (2006.01)

(52) U.S. Cl.
CPC .............. *H01L 41/193* (2013.01); *C08J 5/18* (2013.01); *C08L 27/16* (2013.01); *C08L 53/00* (2013.01)

(58) Field of Classification Search
USPC .................................. 525/88, 94, 99
See application file for complete search history.

(56) References Cited

U.S. PATENT DOCUMENTS

| | | | |
|---|---|---|---|
| 6,147,158 A * | 11/2000 | Chmielewski | 525/66 |
| 7,687,582 B1 * | 3/2010 | Luebben et al. | 525/417 |
| 2004/0127986 A1 | 7/2004 | Chen et al. | |
| 2008/0319131 A1 * | 12/2008 | McCullough et al. | 525/90 |
| 2009/0118420 A1 * | 5/2009 | Zou et al. | 524/577 |
| 2010/0323458 A1 | 12/2010 | Fritsch et al. | |
| 2014/0102533 A1 * | 4/2014 | Hosoda et al. | 136/256 |

* cited by examiner

*Primary Examiner* — Jeffrey Mullis
(74) *Attorney, Agent, or Firm* — Ladas & Parry LLP

(57) ABSTRACT

The present invention relates to a polymer blend composition comprising a dielectric elastomer, an actuator film manufactured using the same, and an actuator comprising the film. The polymer blend composition according to the present invention comprises a block copolymer having excellent compatibility with the dielectric elastomer and excellent dielectric properties, and thus displacement values suitable for the purpose can be obtained by a simple method of adjusting a composition of the polymer blend. Moreover, the film manufactured using the same has high dielectric constant, low dielectric loss and high electromechanical displacement, and thus the film exhibits excellent dielectric properties when it is applied in a dielectric layer for an actuator.

10 Claims, 2 Drawing Sheets

(a)

(b)

POLYMER BLEND COMPOSITION AND ACTUATORS USING THE SAME

CROSS-REFERENCE TO RELATED APPLICATION

This application claims under 35 U.S.C. §119(a) priority to and the benefit of Korean Patent Application No. 10-2011-0044784, filed on May 12, 2011, the entire contents of which are incorporated herein by reference.

BACKGROUND OF THE INVENTION (a) Field of the Invention The present invention relates to a polymer blend composition comprising a dielectric elastomer, an actuator film manufactured using the same, and an actuator comprising the film.

(b) Description of the Related Art

A piezoelectric element is an element showing a piezoelectric effect which converts electrical energy into mechanical energy, and piezoelectric ceramic materials such as quartz, tourmaline, Rochelle salt or the like have been usually used. However, the ceramic materials are highly brittle and hard to process, and thus their application is limited.

Recently, there are growing concerns about dielectric elastomers that exhibit the piezoelectric effect and are also easy to process. The dielectric elastomers have recently gained interest as a material to overcome the drawbacks of the ceramic materials, because they have a high power/weight ratio and high energy efficiency, and are very flexible and easy to process. Unlike hydraulic or aerodynamic actuators, dielectric elastomer actuators do not need life-limited components such as gears and bearings, and this allows a precise design.

The dielectric elastomer actuators have advantages of very rapidly converting electrical energy into mechanical energy and having high displacement values. However, they have a disadvantage of requiring high operating voltage, and many studies on this problem are still under progress. The dielectric elastomer actuators are known to be driven by the Maxwell stress $\sigma$ ($\sigma = \epsilon_0 \epsilon E^2$: wherein $\epsilon_0$, $\epsilon$ and E represent the vacuum permittivity, the dielectric constant, and the electric field strength, respectively).

That is, the Maxwell stress is proportional to the dielectric constant. Thus, there have been attempts to improve operating properties of the actuators by adding conductive fillers such as ceramic filler or carbon black, graphite, and metal particles to dielectric elastomers such as thermoplastic elastomers so as to increase the dielectric constant of the composites. However, the addition of fillers greatly increases a dispersed phase of the fillers to a micrometer level, and a conductive pass is formed by filler aggregation to generate dielectric loss. Thus, there is a limit in the improvement of electromechanical conversion efficiency. In short, the addition of fillers is disadvantageous in that dielectric loss and leakage current are increased, and breakdown strength properties are deteriorated.

To solve these problems, recent studies have suggested a method of directly grafting copper (Cu) phthalocyanine having high dielectric constant or aniline oligomer having excellent electrical conductivity with a urethane-based elastomer or a polyvinylidene fluoride-based polymer. However, the reactivity of this chemical grafting method can be highly restricted depending on the type of dielectric elastomer or the composition to be grafted, and the increase in dielectric loss and the deterioration of breakdown strength properties are also inevitable.

SUMMARY OF THE INVENTION

Therefore, an object of the present invention is to provide a polymer blend composition with excellent compatibility, in which the displacement values suitable for the purpose can be obtained by a simpler method than the previous method of controlling the chemical structure of dielectric elastomers or of adding fillers.

Accordingly, the present invention provides a polymer blend composition comprising:
a dielectric elastomer; and
a block copolymer that includes a segment having compatibility with the dielectric elastomer and an electrical conductivity of less than $10^{-6}$ S/cm and a segment having a conjugated double bond and an electrical conductivity of $10^{-6}$ S/cm or more.

Herein, the dielectric elastomer may be one or more selected from the group consisting of polyvinylidene fluoride-based polymers, acrylic-based polymers, urethane-based polymers, silicone-based polymers, and thermoplastic elastomers.

Meanwhile, in the block copolymer, the segment having compatibility with the dielectric elastomer and an electrical conductivity of less than $10^{-6}$ S/cm may be a segment including one or more repeating units selected from the group consisting of polyurethane, silicone, polyacrylate, poly(methyl methacrylate), polystyrene, polyethylene, polyamide 11, polyvinylacetate, and poly(N-methylethylenimine).

Further, in the block copolymer, the segment having a conjugated double bond and an electrical conductivity of $10^{-6}$ S/cm or more may be a segment including one or more repeating units selected from the group consisting of polythiophene, poly(3-hexylthiophene), polyacetylene, polyaniline, polypyrrole, and polysulfurnitride.

Furthermore, the block copolymer may be a di-block copolymer, a tri-block copolymer, a multi-block copolymer, a star-shaped block copolymer, or a graft copolymer.

Meanwhile, the polymer blend composition according to the present invention may include 80 to 99.99% by weight of the dielectric elastomer; and 0.01 to 20% by weight of the block copolymer. In the block copolymer, a weight ratio of the segment having a conjugated double bond and an electrical conductivity of $10^{-6}$ S/cm or more to the segment having compatibility with the dielectric elastomer and an electrical conductivity of less than 10-6 S/cm may be 1:0.1~10.

Further, another object of the present invention is to provide an actuator film exhibiting excellent dielectric properties, which is manufactured using the polymer blend composition.

Further, still another object of the present invention is to provide an actuator comprising the film.

Herein, the actuator may include a dielectric layer including the film; and electrodes formed on each of the top and bottom surfaces of the dielectric layer.

BRIEF DESCRIPTION OF THE DRAWINGS

The above and other features of the present invention will now be described in detail with reference to certain exemplary embodiments thereof illustrated the accompanying drawings which are given hereinbelow by way of illustration only, and thus are not limitative of the present invention, and wherein.

DETAILED DESCRIPTION

Hereinafter reference will now be made in detail to various embodiments of the present invention, examples of which are illustrated in the accompanying drawings and described below. While the invention will be described in conjunction with exemplary embodiments, it will be understood that present description is not intended to limit the invention to those exemplary embodiments. On the contrary, the invention is intended to cover not only the exemplary embodiments, but also various alternatives, modifications, equivalents and other embodiments, which may be included within the spirit and scope of the invention as defined by the appended claims.

Hereinafter, a polymer blend composition according to the present invention, an actuator film manufactured using the same, and an actuator comprising the film will be described with reference to the accompanying drawings.

Before that, several terms are defined as follows, unless otherwise specified in the present specification and claims.

First, the term 'dielectric elastomer' means a polymer material showing an electric field-induced electrostrictive strain, and it encompasses all polymer materials that have an electrical insulating property and structurally an elastic restoring force.

The term 'electrical insulating segment' means a segment with an electrical conductivity of less than $10^{-6}$ S/cm among the segments included in the predetermined block copolymer, and the term 'electrical conductive segment' means a segment with an electrical conductivity of $10^{-6}$ S/cm or more among the segments included in the predetermined block copolymer.

Meanwhile, the present inventors have made an effort to develop polymer materials for an actuator. As a result, they found that when the dielectric elastomer is used as a base component and mixed with the block copolymer including an electrical insulating segment having compatibility with the dielectric elastomer and an electrical conductive segment having a conjugated double bond, a polymer composition and a film manufactured using the composition show excellent dielectric properties and displacement values suitable for the purpose can be also obtained by a simple method of adjusting the composition of the polymer blend, thereby completing the present invention.

According to one embodiment, the present invention provides a polymer blend composition comprising:

a dielectric elastomer; and a block copolymer that includes a segment having compatibility with the dielectric elastomer and an electrical conductivity of less than $10^{-6}$ S/cm and a segment having a conjugated double bond and an electrical conductivity of $10^{-6}$ S/cm or more.

Figure 1:
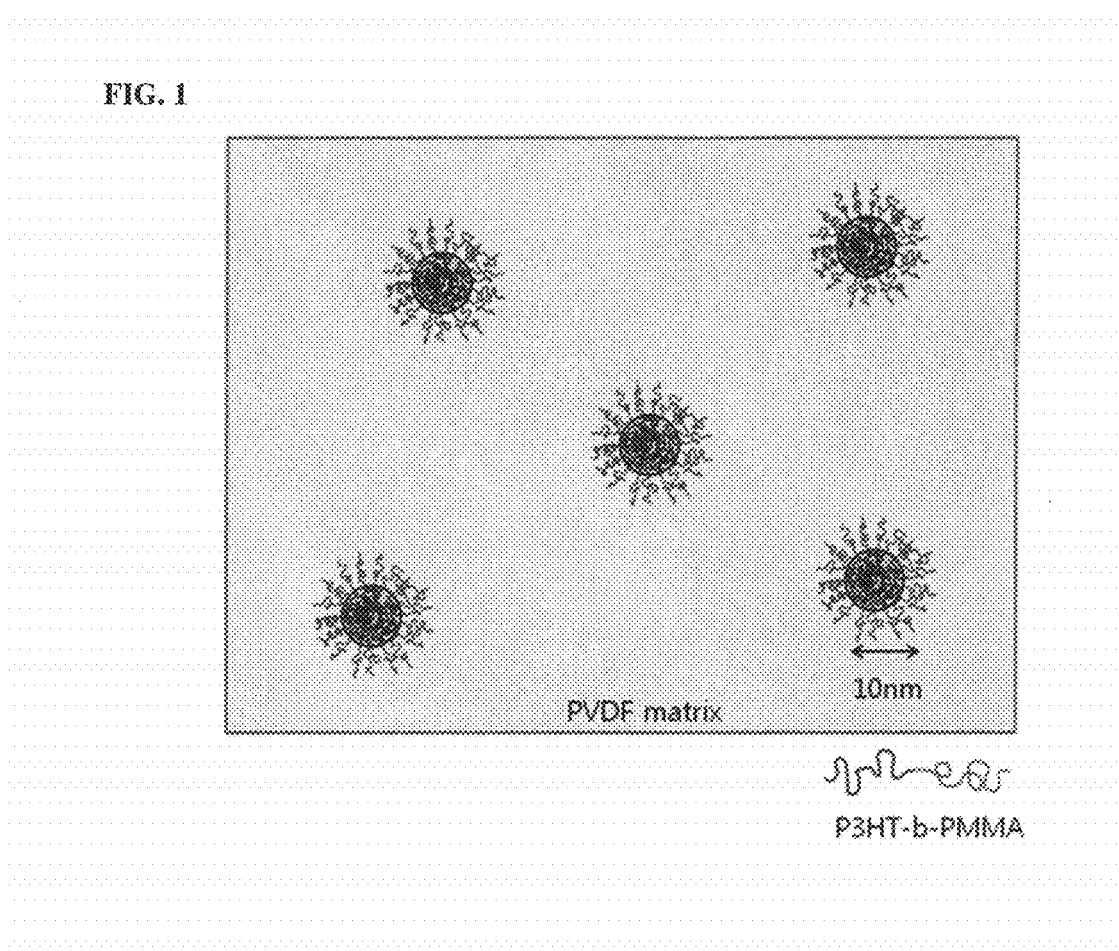
FIG. 1 illustrates the morphology of the polymer blend composition according to one embodiment of the present invention.

FIG. 1 illustrates the morphology of the polymer blend composition according to one embodiment of the present invention, in which the block copolymer is dispersed in a polymer matrix including the dielectric elastomer.

In particular, the polymer blend composition according to the present invention comprises the block copolymer that includes an electrical insulating segment having compatibility with the dielectric elastomer and an electrical conductive segment having a conjugated double bond, and therefore an electrical conductive domain of the block copolymer (red segment, the center of micelle in FIG. 1) can be finely dispersed in the matrix (dielectric elastomer) in a form of micelle with several to several tens of nanometer scale so as to exhibit excellent dielectric properties.

Further, according to the polymer blend composition of the present invention, the displacement values suitable for the purpose can be obtained by a simple method of adjusting the blend composition without repeating the complicated chemical synthetic procedures performed in the prior art.

Herein, the dielectric elastomer included in the polymer blend composition is, as defined above, a polymer material showing an electric field-induced electrostrictive strain, and means a polymer elastomer having an electrical insulating property.

The dielectric elastomer is not particularly limited, as long as it is commonly used in the art, to which this invention belongs. According to the present invention, the dielectric elastomer may be one or more selected from the group consisting of polyvinylidene fluoride-based polymers, acrylic-based polymers, urethane-based polymers, silicone-based polymers, and thermoplastic elastomers; and preferably polyvinylidene fluoride-based polymers, acrylic-based polymers, or mixtures thereof.

Herein, the polyvinylidene fluoride-based polymers may be homopolymers of polyvinylidene fluoride or copolymers containing at least a polyvinylidene fluoride repeating unit; and preferably one or more selected from the group consisting of polyvinylidene fluoride, poly(vinylidene fluoride-co-trifluoroethylene), poly(vinylidene fluoride-co-trifluoroethylene-co-chlorofluoroethylene), and poly(vinylidenefluoride-co-hexafluoroethylene).

Meanwhile, the dielectric elastomer is a component that constitutes the polymer blend composition according to the present invention and forms a matrix of the film manufactured using the same, and it may be a dielectric elastomer having a weight-average molecular weight of 10,000 g/mol or more, considering the mechanical properties required for the film.

Meanwhile, the block copolymer in the polymer blend composition according to the present invention includes a segment having compatibility with the dielectric elastomer and an electrical conductivity of less than $10^{-6}$ S/cm and a segment having a conjugated double bond and an electrical conductivity of $10^{-6}$ S/cm or more.

In the block copolymer, the segment having compatibility with the dielectric elastomer and an electrical conductivity of less than $10^{-6}$ S/cm is a segment that functions to finely disperse the block copolymer in the dielectric elastomer matrix in a form of micelle. It is preferable that the segment has an electrical conductive property within the above range in order to secure compatibility of the block copolymer with the dielectric elastomer and an electrical insulating property.

Herein, the segment is not particularly limited, as long as it has compatibility with the dielectric elastomer and shows the electrical insulating property. However, according to the present invention, the electrical insulating segment having compatibility with the dielectric elastomer is a non-conjugated polymer block, and may include one or more repeating units selected from the group consisting of polyurethane, silicone, polyarcylate, poly(methyl methacrylate), polystyrene, polyethylene, polyamide 11, polyvinylacetate, and poly(N-methylethylenimine.

Meanwhile, in the block copolymer, the segment having a conjugated double bond and an electrical conductivity of $10^{-6}$ S/cm or more is a segment capable of improving the dielectric properties of the composition by synergistic effects with the dielectric elastomer, and it may be a segment that includes a conjugated double bond in its structure and has an electrical conductivity of $10^{-6}$ S/cm or more, preferably 10-1 S/cm or more, at the same time.

Herein, the segment is not particularly limited, as long as it has a conjugated double bond and an electrical conductive property. However, according to the present invention, the segment having the conjugated double bond and the electrical conductivity within the above range may include one or more repeating units selected from the group consisting of polythiophene, poly(3-hexylthiophene), polyacetylene, polyaniline, polypyrrole, and polysulfurnitride.

That is, as the block copolymer includes the above described segment having compatibility with the dielectric elastomer and the segment having a conjugated double bond and an electrical conductive property, it obtains the basic compatibility with the dielectric elastomer, and is also dispersed in the dielectric elastomer matrix in a form of micelle so as to exhibit more excellent dielectric properties by synergistic effects with the dielectric elastomer.

According to the present invention, the block copolymer may include a variety of combinations of the above exemplified segments. In particular, the block copolymer according to the present invention may be P3HT-b-PMMA (poly(3-hexylthiophene)-b-polymethylmethacryalte) represented by the following Chemical Formula 1, PANI-b-PMMA (polyaniline-b-polymethylmethacryalte) represented by the following Chemical Formula 2, or P3HT-b-PBA (poly(3-hexylthiophene)-b-polybutylacrylate) represented by the following Chemical Formula 3. However, the present is not limited to the above combinations, and many other combinations are also possible, taking into account the compatibility with the dielectric elastomer, the dielectric properties or the like.

Further, the amount of each segment in the block copolymer may be adjusted within various ranges, considering the effects of each segment or the like. A weight ratio of the electrical conductive segment having a conjugated double bond to the electrical insulating segment having compatibility with the dielectric elastomer may be preferably adjusted within the range of 1:0.1~10, and more preferably within the range of 1:0.5~5.

Further, the block copolymer may have a weight-average molecular weight of 1,000 g/mol or more, and preferably 3,000 g/mol or more, considering the electrical conductivity, the size of nano dispersed phase of the micelle structure or the like.

Meanwhile, the polymer blend composition according to the present invention may include 80 to 99.99% by weight of the dielectric elastomer and 0.01 to 20% by weight of the block copolymer; preferably 85 to 99.9% by weight of the dielectric elastomer and 0.1 to 15% by weight of the block copolymer; and more preferably 90 to 99.5% by weight of the dielectric elastomer and 0.5 to 10% by weight by weight of the block copolymer.

That is, considering the synergistic effects of improving dielectric property, compatibility or the like, the polymer blend composition according to the present invention may be included in an amount of 0.01 to 20% by weight, based on the total weight of the composition.

Meanwhile, the polymer blend composition according to the present invention may further include additives such as a

[Chemical Formula 1]

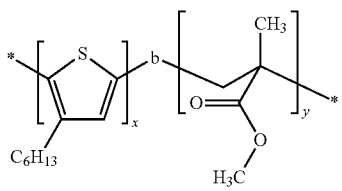

[Chemical Formula 2]

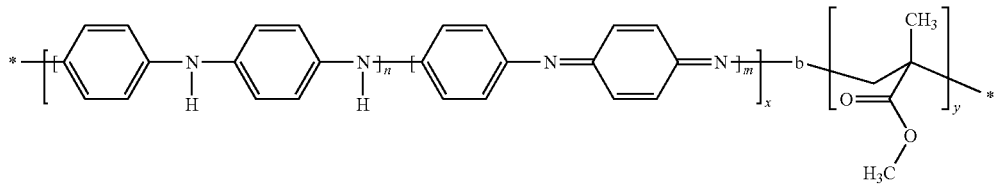

[Chemical Formula 3]

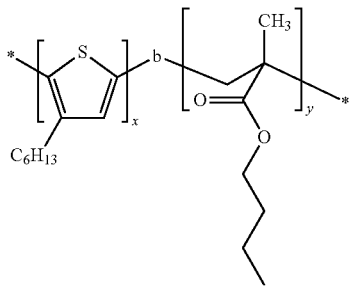

(In Chemical Formula 1 to Chemical Formula 3, each of x and y is the degree of polymerization, and n+m=1)

In this connection, the type of the block copolymer is not particularly limited, and the block copolymer may be preferably a di-block copolymer, a tri-block copolymer, a multi-block copolymer, a star-shaped block copolymer, or a graft copolymer.

dispersion stabilizer and an antioxidant commonly used in the art, to which this invention belongs, in addition to the above described components.

Further, the polymer blend composition according to the present invention may be prepared by a solution method or a melting method commonly used in the art, to which this invention belongs. The solution method is preferred because a blend with a uniform composition can be prepared.

According to another embodiment, the present invention provides an actuator film that is manufactured using the above described polymer blend composition.

As the film is manufactured using the above described polymer blend composition, displacement values suitable for the purpose can be obtained by a simple method of adjusting a composition of the polymer blend. Moreover, as the film is manufactured using the above described polymer blend composition, it has high dielectric constant, low dielectric loss and high electromechanical displacement, and thus exhibits excellent dielectric properties when it is applied in a dielectric layer for an actuator.

The film may be manufactured by a method commonly used in the art, to which this invention belongs, except for using the above described polymer blend composition. According to one Example of the present invention, the film may be manufactured by casting or melt molding the polymer blend composition using a hot press of 150 to 250° C. However, the method of manufacturing the film is not limited thereto.

In this connection, a thickness of the film is determined considering the piezoelectric properties, the dielectric properties or the like, and the film according to the present invention may have a thickness of 10 to 2000 μm, preferably 10 to 1500 μm, and more preferably 10 to 1000 μm.

According to still another embodiment, the present invention provides an actuator comprising the above described film.

Preferably, the actuator includes a dielectric layer including the film; and electrodes formed on each of the top and bottom surfaces of the dielectric layer. As the film includes the dielectric layer, it is able to exhibit excellent dielectric properties such as high dielectric constant, low dielectric loss, and high electromechanical displacement.

Herein, the electrodes included in the actuator may include an electrode material commonly used in the art, to which this invention belongs. According to one embodiment of the present invention, the electrode may include conductive metals, conductive metal oxides, carbon compounds, conductive polymers or the like, and it may preferably include one or more selected from the group consisting of gold (Au), silver (Ag), aluminum (Al), platinum (Pt), carbon (C), carbon nanotube, graphene, polypyrrole, polyaniline, polypiperazine, polyacetylene, and 3,4-ethylenedioxythiophene.

In this connection, the electrodes may be formed by a method commonly used in the art, to which this invention belongs. According to one embodiment of the present invention, a conductive metal layer or a conductive metal oxide layer may be formed on each of the top and bottom surfaces of the dielectric layer by a sputtering method. In addition, the composition including a carbon compound or a conductive polymer may be applied to the dielectric layer, and then dried or cured so as to form the electrodes.

EXAMPLES

Hereinafter, the preferred Examples are provided for better understanding. However, these Examples are for illustrative purposes only, and the invention is not intended to be limited by these Examples.

Example 1

A polyvinylidene fluoride-based polymer, P(VDF-co-TrFE) (poly(vinylidenefluoride-co-trifluoroethylene)) (VDF of approximately 65 mol %, weight-average molecular weight: 100,000 g/mol, manufacturer: Ardrich) was prepared as a dielectric elastomer, and $P_3HT$-b-PMMA (poly(3-hexylthiophene)-b-polymethylmethacryalte) was prepared as a block copolymer ($P_3HT$ of approximately 50 wt %, PMMA of approximately 50 wt %, weight-average molecular weight: 5,000 g/mol).

The polymers were added to a dimethylformamide (DMF) solvent at a weight ratio of P(VDF-co-TrFE) of approximately 99% by weight and $P_3HT$-b-PMMA of approximately 1% by weight (approximately 0.5% by weight, based on P3HT content) and dissolved, and then the polymer solution was precipitated in distilled water to remove the solvent using a filter.

The precipitate obtained by the above procedure was dried in a vacuum oven at 60° C., and the dried polymer blend composition was used to manufacture a film with a thickness of 100 μm by hot press at 200° C.

Subsequently, an actuator was manufactured by applying a gold (Au) electrode on each of the top and bottom surfaces of the film by a sputtering method.

Example 2

An actuator was manufactured in the same manner and under the same conditions as in Example 1, except that PANI-b-PMMA (polyaniline-b-polymethylmethacryalte, PANI of approximately 45 wt %, PMMA of approximately 55 wt %, weight-average molecular weight: 15,000 g/mol) was used as a block copolymer instead of $P_3HT$-b-PMMA; and P(VDF-co-TrFE) of approximately 98.9% by weight and PANI-b-PMMA of approximately 1.1% by weight (approximately 0.5% by weight, based on PANI content) were mixed and used as a polymer blend composition in Example 1.

Example 3

An acrylic-based polymer, acrylic rubber (Mooney viscosity (121° C.) MLmin(pts) −56.5, product name: PA402, manufacturer: Kwang shin Industry) was prepared as a dielectric elastomer, and $P_3HT$-b-PBA (poly(3-hexylthiophene)-b-polybutylacryalte) was prepared as a block copolymer ($P_3HT$ of approximately 50 wt %, PBA of approximately 50 wt %, weight-average molecular weight: 6,000 g/mol).

The polymers were added to a tetrahydrofuran (THF) solvent at a weight ratio of acrylic rubber of approximately 99% by weight and $P_3HT$-b-PBA of approximately 1% by weight (approximately 0.5% by weight, based on $P_3HT$ content) and dissolved, and then the solvent was evaporated to obtain a polymer blend composition.

The polymer blend composition was used to manufacture a film with a thickness of 100 um by hot press at 200° C.

Subsequently, electrodes are formed by applying carbon grease (product name: 846-1P, manufacturer: MG Chemicals) on each of the top and bottom surfaces of the film so as to manufacture an actuator.

Comparative Example 1

An actuator was manufactured in the same manner and under the same conditions as in Example 1, except that a film was formed using P(VDF-co-TrFE) without the block copolymer $P_3HT$-b-PMMA in Example 1.

Comparative Example 2

An actuator was manufactured in the same manner and under the same conditions as in Example 1, except that a homopolymer P₃HT (weight-average molecular weight: 15,000 g/mol, manufacturer: Ardrich) was used instead of the block copolymer P₃HT-b-PMMA; and P(VDF-co-TrFE) of approximately 99.5% by weight and P₃HT of approximately 0.5% by weight were mixed and used as a polymer blend composition in Example 1.

Comparative Example 3

An actuator was manufactured in the same manner and under the same conditions as in Example 1, except that a homopolymer PANI (weight-average molecular weight: 50,000 g/mol, manufacturer: Ardrich) was used instead of the block copolymer PANI-b-PMMA; and P(VDF-co-TrFE) of approximately 99.5% by weight and PANT of approximately 0.5% by weight were mixed and used as a polymer blend composition in Example 2.

Comparative Example 4

An actuator was manufactured in the same manner and under the same conditions as in Example 1, except that a film was formed using acrylic rubber without the block copolymer P₃HT-b-PBA in Example 3.

Comparative Example 5

An actuator was manufactured in the same manner and under the same conditions as in Example 3, except that a homopolymer P₃HT (weight-average molecular weight: 15,000 g/mol, manufacturer: Ardrich) was used instead of the block copolymer P₃HT-b-PBA; and acrylic rubber of approximately 99.5% by weight and P₃HT of approximately 0.5% by weight were mixed and used as a polymer blend composition in Example 3.

Experimental Example 1

Figure 2:
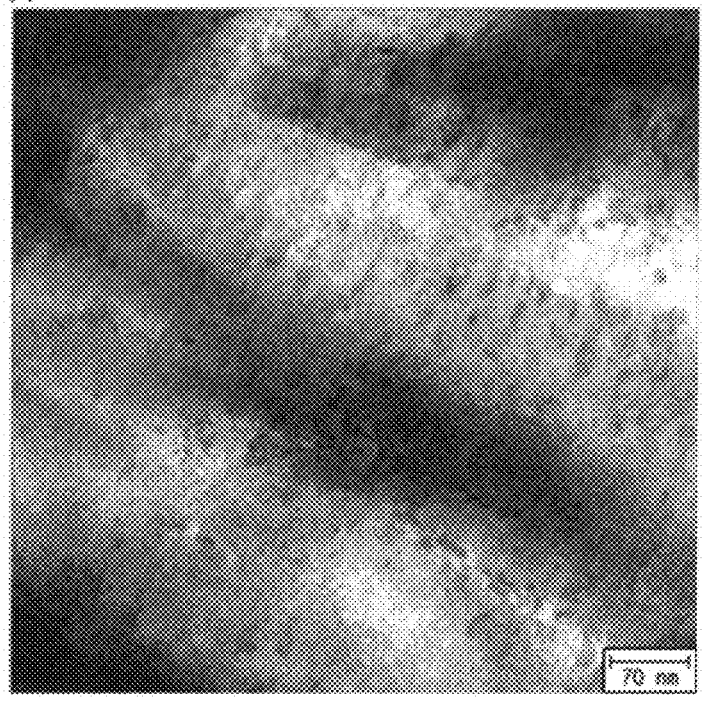
FIG. 2 is TEM images showing magnification of the polymer blend compositions according to Example (a) and Comparative Example (b) of the present invention.
Figure 2:
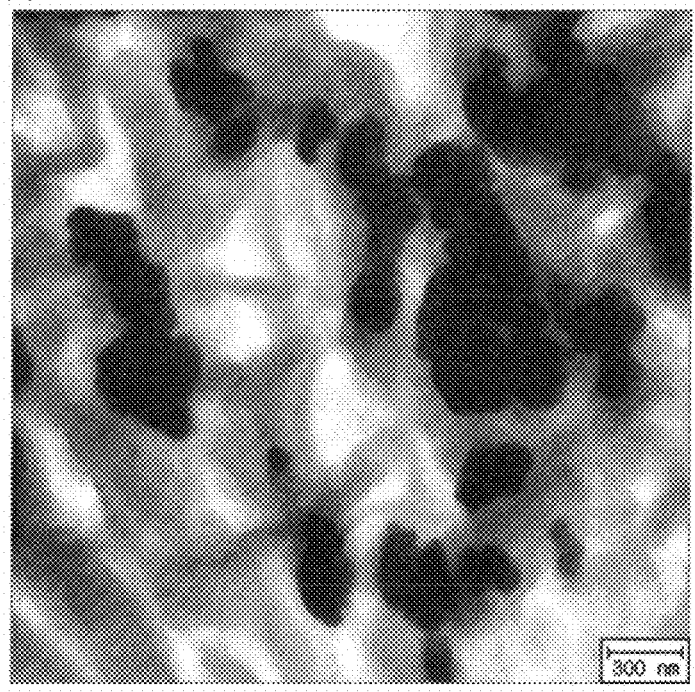

In order to evaluate compatibility of the polymer blend compositions according to Example 1 (P(VDF-co-TrFE)/P₃HT-b-PMMA) and Comparative Example 2 (P(VDF-co-TrFE)/P₃HT), each composition was magnified and observed by transmission electron microscopy (TEM) at 190° C., and the results are shown in FIG. 2. In FIG. 2, (a) shows the result of the composition of Example 1 and (b) shows the result of the composition of Comparative Example 2.

As shown in FIG. 2, aggregates with a size of several micrometers were observed in the matrix of the composition according to Comparative Example 2 (b) and no particle dispersion was observed in the composition according to Example 1 (a).

That is, P₃HT did not show compatibility with the P(VDF-co-TrFE) polymer matrix and was irregularly dispersed as aggregates with a size of several micrometers in the composition according to Comparative Example 2 (b), whereas the composition according to Example 1 (a) showed excellent compatibility of P₃HT-b-PMMA with P(VDF-co-TrFE) and thus P₃HT-b-PMMA formed uniform micelles with a size of several nanometers in the P(VDF-co-TrFE) matrix, as shown in FIG. 1.

Experimental Example 2

The dielectric properties of the actuators according to Examples 1~2 and Comparative Examples 1~3 were measured by the following method, and the results are shown in the following Table 1.

1) Dielectric Constant (K) and Dielectric Loss (tan θ)

: The dielectric constant and dielectric loss were measured using an impedance analyzer (model: HP1492A, manufacturer: Hewlett-Packard) at room temperature and 1 KHz, respectively.

2) Electromechanical Displacement (%) (Sz, %)

: In order to measure a thickness strain (Sz) compressed in a thickness direction when a voltage is applied, laser equipment (model: Keyence LK-G80, manufacturer: Keyenece) was used to measure each displacement at 10.65 V/μm, and the values were calculated using the following Equation.

$$Sz(\%) = [(t-t_o)/t_o] \times 100 \quad [\text{Equation}]$$

(wherein $t_o$ and $t$ represent the sample thickness before and after applying a voltage, respectively)

TABLE 1

| Section | Dielectric constant (K) (at 1 KHz) | Dielectric loss (tan δ) (at 1 KHz) | Electromechanical displacement (%) (at 10.65 V/μm) |
|---|---|---|---|
| Example 1 (P(VDF-co-TrFE)/P₃HT-b-PMMA) | 31.5 | 0.03 | −2.8 |
| Example 2 (P(VDF-co-TrFE)/PANI-b-PMMA) | 30.0 | 0.01 | −3.2 |
| Example 3 (acrylic rubber/P₃HT-b-PBA) | 35.0 | 0.02 | −10.1 |
| Comparative Example 1 (P(VDF-co-TrFE)) | 9.47 | 0.01 | −0.1 |
| Comparative Example 2 (P(VDF-co-TrFE)/P₃HT) | 18.1 | 0.20 | −1.0 |
| Comparative Example 3 (P(VDF-co-TrFE)/PANI) | 16.6 | 0.04 | −1.2 |
| Comparative Example 4 (acrylic rubber) | 4.1 | 0.05 | −1.5 |
| Comparative Example 5 (acrylic rubber/P₃HT) | 6.3 | 0.31 | −3.4 |

As shown in Table 1, since the polymer blend composition according to the present invention was used in the actuators of Examples 1~2, the actuators showed higher dielectric constant and lower dielectric loss as well as higher electromechanical displacement than those of Comparative Examples 1~3, indicating excellent dielectric properties.

What is claimed is:

1. A polymer blend composition consisting essentially of:
   a poly(vinylidene fluoride-co-trifluoroethylene) dielectric elastomer; and
   a block copolymer that includes a segment having compatibility with the poly(vinylidene fluoride-co-trifluoroethylene) dielectric elastomer and an electrical conductivity of less than $10^{-6}$ S/cm and a segment having a conjugated double bond and an electrical conductivity of $10^{-6}$ S/cm or more.

2. The polymer blend composition according to claim 1, wherein the segment having compatibility with the poly(vinylidene fluoride-co-trifluoroethylene) dielectric elastomer and an electrical conductivity of less than $10^{-6}$ S/cm in the block copolymer includes at least a methyl methacrylate repeating unit.

3. The polymer blend composition according to claim 1, wherein the segment having a conjugated double bond and an electrical conductivity of $10^{-6}$ S/cm or more in the block copolymer includes at least a 3-hexylthiophene repeating unit.

4. The polymer blend composition according to claim 1, wherein the block copolymer is a di-block copolymer.

5. The polymer blend composition according to claim 1, comprising the dielectric elastomer of 80 to 99.99% by weight; and the block copolymer of 0.01 to 20% by weight.

6. The polymer blend composition according to claim 1, wherein a weight ratio of the segment having a conjugated double bond and an electrical conductivity of $10^{-6}$ S/cm or more to the segment having compatibility with the dielectric elastomer and an electrical conductivity of less than $10^{-6}$ S/cm is 1:0.1~10 in the block copolymer.

7. An actuator film having dielectric constant (K) of 30.0 to 31.5 at 1 KHz, dielectric loss (tan $\delta$) of 0.01 to 0.03 at 1 KHz, and electromechanical displacement of −3.2 to −2.8% at 10.65 V/μm that is manufactured using the polymer blend composition according to claim 1.

8. An actuator comprising the film according to claim 7.

9. The actuator according to claim 8, comprising the film as a dielectric layer; and electrodes formed on each of the top and bottom surfaces of the film.

10. The actuator according to claim 9, wherein the electrode include one or more materials selected from the group consisting of gold (Au), silver (Ag), aluminum (Al), platinum (Pt), carbon (C), carbon nanotube, graphene, polypyrrole, polyaniline, polypiperazine, polyacetylene, and 3,4-ethylenedioxythiophene.

* * * * *